US009036691B2

(12) United States Patent
Hori

(10) Patent No.: US 9,036,691 B2
(45) Date of Patent: May 19, 2015

(54) RF SIGNAL GENERATING CIRCUIT, AND TRANSMITTER

(75) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/342,678

(22) PCT Filed: Aug. 21, 2012

(86) PCT No.: PCT/JP2012/071090
§ 371 (c)(1),
(2), (4) Date: Mar. 4, 2014

(87) PCT Pub. No.: WO2013/035523
PCT Pub. Date: Mar. 14, 2013

(65) Prior Publication Data
US 2014/0205041 A1    Jul. 24, 2014

(30) Foreign Application Priority Data

Sep. 9, 2011   (JP) ................................ 2011-197002

(51) Int. Cl.
*H04L 27/00*   (2006.01)
*H04L 25/49*   (2006.01)
(Continued)

(52) U.S. Cl.
CPC ........ *H04L 27/0008* (2013.01); *H04L 25/4902* (2013.01); *H03F 3/2178* (2013.01); *H03K 7/08* (2013.01); *H03F 2200/351* (2013.01);
(Continued)

(58) Field of Classification Search
CPC ......... H03K 7/08; H03F 3/217; H03F 3/2178; H03F 2200/351; H04B 14/026; H04B 14/06; H04B 14/062; H04L 25/4902

USPC ........... 375/238, 295, 247; 341/143; 332/109; 370/212

See application file for complete search history.

(56) References Cited

U.S. PATENT DOCUMENTS

2007/0123184 A1*   5/2007   Nesimoglu et al. ........ 455/127.1
2009/0273396 A1*  11/2009   Nam et al. ...................... 330/10
(Continued)

FOREIGN PATENT DOCUMENTS

JP   2005-236968   9/2005
JP   2009-517912   4/2009
WO  WO 2011/078120  6/2011

OTHER PUBLICATIONS

International Search Report, PCT/JP2012/071090, Oct. 23, 2012.
(Continued)

*Primary Examiner* — Young T Tse
(74) *Attorney, Agent, or Firm* — Young & Thompson

(57) ABSTRACT

An RF signal generating circuit that generates, from a digital signal, an RF pulse signal to be radio-transmitted. It includes a polar converter generating an amplitude signal and a phase signal from the digital signal; a signal decomposer receiving the amplitude signal as an input signal, and generates two signals, a pulse width control signal and a residual signal; a delta sigma modulator subjecting the residual signal to delta-sigma modulation; a pulse width modulator subjecting the phase signal to pulse modulation in accordance with the pulse width control signal, and outputting a pulse phase signal; and a mixer that mixes a signal output from the delta sigma modulator and the pulse phase signal to output the RF pulse signal. The signal decomposer generates the pulse width control and residual signals if a product of a fundamental wave component of the pulse phase and residual signals equals the amplitude signal.

9 Claims, 12 Drawing Sheets

(51) Int. Cl.
  *H03F 3/217* (2006.01)
  *H03K 7/08* (2006.01)
  *H03F 1/02* (2006.01)
  *H03F 1/06* (2006.01)
  *H03F 1/26* (2006.01)
  *H03F 3/24* (2006.01)
  *H03F 3/68* (2006.01)
  *H03F 3/72* (2006.01)

(52) U.S. Cl.
  CPC ........... *H03F1/0277* (2013.01); *H03F 1/06* (2013.01); *H03F 1/26* (2013.01); *H03F 3/2173* (2013.01); *H03F 3/24* (2013.01); *H03F 3/68* (2013.01); *H03F 3/72* (2013.01); *H03F 2200/336* (2013.01); *H03F 2200/408* (2013.01); *H03F 2203/7221* (2013.01); *H03F 2203/7236* (2013.01)

(56) References Cited

U.S. PATENT DOCUMENTS

2012/0257670 A1* 10/2012 Nagatani et al. ............. 375/238
2013/0016795 A1* 1/2013 Kunihiro et al. ............. 375/295

OTHER PUBLICATIONS

Jinseong Jeong, Yuanxun Ethan Wang, "A Polar Delta-Sigma Modulation (PDSM) Scheme for High Efficiency Wireless Transmitters", Microwave Symposium, 2007. IEEE/MTT-S International, Jun. 2007, pp. 73-76.

* cited by examiner

| INPUT VOLTAGE (Vin) | 0~b₁ | b₁~b₂ | | b_{k-1}~b_k | b_{N-1}~1.0 |
|---|---|---|---|---|---|
| RESIDUAL OUTPUT (Va) | 1/b₁ × Vin | 1/b₂ × Vin | | 1/b_k × Vin | Vin |
| PULSE WIDTH CONTROL SIGNAL (Vpc) | b₁ | b₂ | | b_k | 1.0 |

$b_1, \cdots, b_{N-1}$ ARE ANY NUMBER BETWEEN 0 AND 1 AND $b_1 < b_2 < \cdots < b_{N-1}$

PRIOR ART

PRIOR ART

RF SIGNAL GENERATING CIRCUIT, AND TRANSMITTER

TECHNICAL FIELD

The present invention relates to an RF (Radio Frequency) signal generating circuit and a transmitter. In particular, the present invention relates to an RF signal generating circuit and a transmitter, which generate an RF pulse signal from a digital signal.

Priority is claimed on Japanese Patent Application No. 2011-197002, filed Sep. 9, 2011, the contents of which are incorporated herein by reference.

BACKGROUND ART

A transmitter in a communication device such as a cellular phone or a wireless LAN (Local Area Network) is required to operate with a low (electric) power consumption while securing a desired output accuracy for transmitted signals, regardless of the degree of output power. In particular, a power amplifier circuit as a final step in the transmitter of the communication device is required to have a high power efficiency since the power amplifier circuit consumes 50% or higher of electric power consumed by the entire communication device.

In recent years, a switching amplifier circuit has attracted attention as a power amplifier circuit having a high power efficiency. The switching amplifier circuit simulates a pulse wave signal as an input signal and performs the power amplification while maintaining the relevant waveform. The pulse wave signal amplified by the switching amplifier circuit is emitted via an antenna toward the air after frequency components other than a desired frequency component are sufficiently reduced utilizing filter elements.

FIG. 12 shows an example of a circuit configuration for a class-D amplifier circuit as a representative of known switching amplification circuits.

The shown class-D amplifier circuit is formed by serially inserting two switch elements between a power supply and the ground. Complementary pulse signals as switching (opening and closing) control signals are input into the two switch elements so that only one of the switch elements is on (i.e., in the on position). When the switch element provided at the power supply is on and the switch element provided at the ground is off (i.e., in the off position), a voltage equal to the power supply voltage is output. In the reverse case, a voltage equal to the ground potential is output.

The above class-D amplifier circuit requires no bias current. Therefore, ideally, power loss is zero. In addition, the above switch elements can be implemented utilizing MOS (Metal-Oxide-Semiconductor) field-effect transistors or bipolar transistors.

FIG. 13 shows an example of a block configuration for a known transmitter that employs a class-D amplifier circuit (such a configuration may be analogized based on a signal generator in FIG. 1 of Non-Patent Document 1).

The transmitter has an RF signal generator, a driver amplifier, a class-D amplifier circuit, a filter, and the like, and amplifies an RF pulse signal (generated by the RF signal generator) utilizing the driver amplifier and the class-D amplifier circuit. A filter circuit next to the class-D amplifier circuit removes unnecessary components in the RF pulse signal amplified by the electric power so as to regenerate an RF radio signal.

The RF signal generator consists of a digital baseband processor, a polar converter, a ΔΣ (delta sigma) modulator, a comparator, and a mixer.

The polar converter converts orthogonal radio signals (I(t), Q(t)) generated by the digital baseband processor into an amplitude signal A(t) and a phase signal P(t) in accordance with the following formulas (1) and (2).

[Formula 1]
$$A(t) = \sqrt{I(t)^2 + Q(t)^2} \quad (1)$$

[Formula 2]
$$P(t) = \sin(\omega_c \cdot t + \alpha) \quad (2)$$

Here, α is computed by the following formula (3)

[Formula 3]
$$\alpha = \tan^{-1}(I(t)/Q(t)) \quad (3)$$

In addition, $\omega_c$ denotes an angular frequency corresponding to a carrier frequency. Furthermore, as shown in the following formula (4), an RF radio signal RF(t) is a product of A(t) and P(t).

[Formula 4]
$$RF(t) = A(t) \cdot P(t) \quad (4)$$

The comparator converts the phase signal P(t) having a sine waveform into a pulse signal having a rectangular form through a comparative operation utilizing a threshold of zero. The pulse phase signal PR(t) is represented by the following formula (5).

[Formula 5]
$$PR(t) = P(t) + H(t) \quad (5)$$

Here, H(t) is a harmonic component of P(t), that is generated when shaping P(t) to have a rectangular form.

The ΔΣ modulator operates in synchronism with a clock signal supplied from an external fixed clock source, and subjects the amplitude signal A(t) to ΔΣ modulation. As a specific example of the ΔΣ modulator, a configuration diagram of a known primary ΔΣ modulator is shown in FIG. 14. This ΔΣ modulator consists of delay devices, a quantizer, an adder, and a subtracter.

In this example, the quantizer is a 1-bit comparator that outputs a value of 1 or −1 by comparing the value of an input signal with a threshold. When the input signal and the output signal of the ΔΣ modulator are each denoted by Y(z) and W(z) and quantization noise generated in the quantizer is denoted by N(z), the following formula (6) is obtained between them.

[Formula 6]
$$W(z) = Y(z) + (1 - z^{-1}) \cdot N(z) \quad (6)$$

In the above formula, $z = e^{j(2\pi f/fs)}$, where fs denotes a clock rate (i.e., sampling frequency) of the clock signal used in the ΔΣ modulator.

The above formula (6) means that the output signal W(z) includes the input signal and a component obtained by multiplying the quantization noise by $(1-z^{-1})$ as a coefficient. The absolute value of $(1-z^{-1})$ closes to zero in a frequency range that is sufficiently less than the sampling frequency, and the absolute value is 2 (maximum value) at a Nyquist frequency (that is defined as one-half of the sampling frequency).

When considering that a signal-to-quantization noise ratio here is represented by a ratio between Y(z) and $(1-z^{-1}) \cdot N(z)$ in the above formula (6), in the present ΔΣ modulator, the lower the frequency range (i.e., sufficiently lower than the sampling frequency), the smaller the quantization noise, so that the noise is vanishingly low and a high signal-to-quantization noise ratio can be obtained. In contrast, the signal-to-quantization noise ratio is low in a relatively high frequency range.

That is, under a condition that the frequency band for signals is sufficiently low, the ΔΣ modulator can reduce incorporation of quantization noise into the relevant band. When A(z) denotes a signal obtained by subjecting the amplitude signal A(t) to Z conversion, the output signal of the ΔΣ modulator is represented by the following formula (7).

[Formula 7]

$$W(z) = A(z) + (1-z^{-1}) \cdot N(z) \qquad (7)$$

When representing this formula in a time domain, the following formula (8) is obtained.

[Formula 8]

$$W(t) = A(t) + NH(t) \qquad (8)$$

Here, NH(t) is the sum of a component obtained by representing the quantization noise $(1-z^{-1}) \cdot N(z)$ (see above formula (7)) in a time region and an image component of A(t) that appears when representing A(z) in a time region, where the image component appears within a range greater than or equal to the Nyquist frequency.

The mixer in FIG. 13 outputs a product of a signal output from the ΔΣ modulator and a signal output from the comparator. A signal MIX(t) output from the mixer is represented by the following formula (9).

[Formula 9]

$$MIX(t) = A(t) \cdot P(t) + A(t) \cdot H(t) + P(t) \cdot NH(t) + NH(t) \cdot H(t) \qquad (9)$$

The first term of formula (9) corresponds to the radio signal RF(t) represented by the above formula (4). This means that the RF signal generator can generate a pulse signal that includes a radio signal. The radio signal can be amplified to have a desired level by inputting the pulse signal via the driver amplifier into the class-D amplifier circuit.

Although the unnecessary components from the second term in formula (9) are also amplified, the filter next to the class-D amplifier circuit removes components out of the band of the filter.

PRIOR ART DOCUMENT

Non-Patent Document

Non-Patent Document 1: Jinseong Jeong, Yuanxun Ethan Wang, "A Polar Delta-Sigma Modulation (PDSM) Scheme for High Efficiency Wireless Transmitters", Microwave Symposium, 2007. IEEE/MTT-S International, June 2007, pp. 73-76.

DISCLOSURE OF INVENTION

Problem to be Solved by the Invention

ACLR (Adjacent Channel Leakage Ratio) is one of the items included in the currently effective standards for carriers. This term requires that electric power that leaks out to a channel next to a channel occupied by a desired signal is reduced to have a value less than or equal to a standard value.

For example, an ACLR in a W-CDMA (Wideband Code Division Multiple Access) standard for base stations requires 45 dB or greater with an offset of 5 MHz The pulse signal generated by the RF signal generator in the transmitter of FIG. 13 includes not only a desired signal, but also quantization noise.

In the transmitter of FIG. 13, the filter connected to the output of the class-D amplifier circuit removes quantization noise out of the pass band of the filter. However, generally, a channel next to the current channel is present within the band of the filter. Therefore, the quantization noise that leaks out to the next channel cannot be removed the filter. Accordingly, the quantization noise needs to be sufficiently reduced before the filter, that is, has to be sufficiently reduced at the output of the class-D amplifier circuit or at least the output of the RF signal generator, so as to satisfy the ACLR standard.

However, the quantization noise cannot be sufficiently reduced by the signal generating device as shown in FIG. 13, so that the ACLR in the W-CDMA standard cannot be satisfied.

Means for Solving the Problem

In order to solve the above problem, the present invention provides an RF signal generating circuit that generates, from a digital signal, an RF pulse signal to be radio-transmitted, the circuit comprising:

a polar converter that generates an amplitude signal and a phase signal from the digital signal;

a signal decomposer that receives, as an input signal, the amplitude signal output from the polar converter, and generates two signals which are a pulse width control signal and a residual signal;

a delta sigma modulator that subjects the residual signal to delta-sigma modulation;

a pulse width modulator that subjects the phase signal output from the polar converter to pulse modulation in accordance with the pulse width control signal, and outputs a pulse phase signal; and a mixer that mixes a signal output from the delta sigma modulator and the pulse phase signal together to output the RF pulse signal, wherein the signal decomposer generates the pulse width control signal and the residual signal under a condition that a product of a fundamental wave component of the pulse phase signal and the residual signal equals the amplitude signal.

The present invention also provides a transmitter that generates, from a digital signal, an RF pulse signal to be radio-transmitted, the transmitter comprising:

a polar converter that generates an amplitude signal and a phase signal from the digital signal;

a signal decomposer that receives, as an input signal, the amplitude signal output from the polar converter, and generates two signals which are a pulse width control signal and a residual signal;

a N-level delta sigma modulator that subjects the residual signal to delta-sigma modulation to output a N-level signal having a step-by-step value, where N is an integer of 2 or greater;

a pulse width modulator that subjects the phase signal output from the polar converter to pulse modulation in accordance with the pulse width control signal, and outputs a pulse phase signal;

a mixer that mixes a signal output from the N-level delta sigma modulator and the pulse phase signal together to output the RF pulse signal; and a class-D amplifier circuit that has two or more switch elements connected respectively to power supplies which have different power-supply voltages, wherein the signal decomposer generates the pulse width control signal and the residual signal under a condition that a product of a fundamental wave component of the pulse phase signal and the residual signal equals the amplitude signal; and in accordance with the value of the signal output from the N-level delta sigma modulator, the class-D amplifier circuit makes only one of the switch elements on and makes all other switch elements off.

The above-described disclosure of the invention does not recite all features of the present invention, and any subcombination between them may form the invention.

Effect of the Invention

As shown by the above explanations, in accordance with the present invention, quantization noise generated by a ΔΣ modulator can be reduced, and thereby an RF pulse signal having a preferable signal-to-noise ratio can be generated.

MODE FOR CARRYING OUT THE INVENTION

Below, the present invention will be explained utilizing embodiments. However, the following embodiments do not limit the present invention pertaining to the claims, and it is not always necessary to employ all combinations between features described in the embodiments so as to solve the above-described problem.

Figure 1:
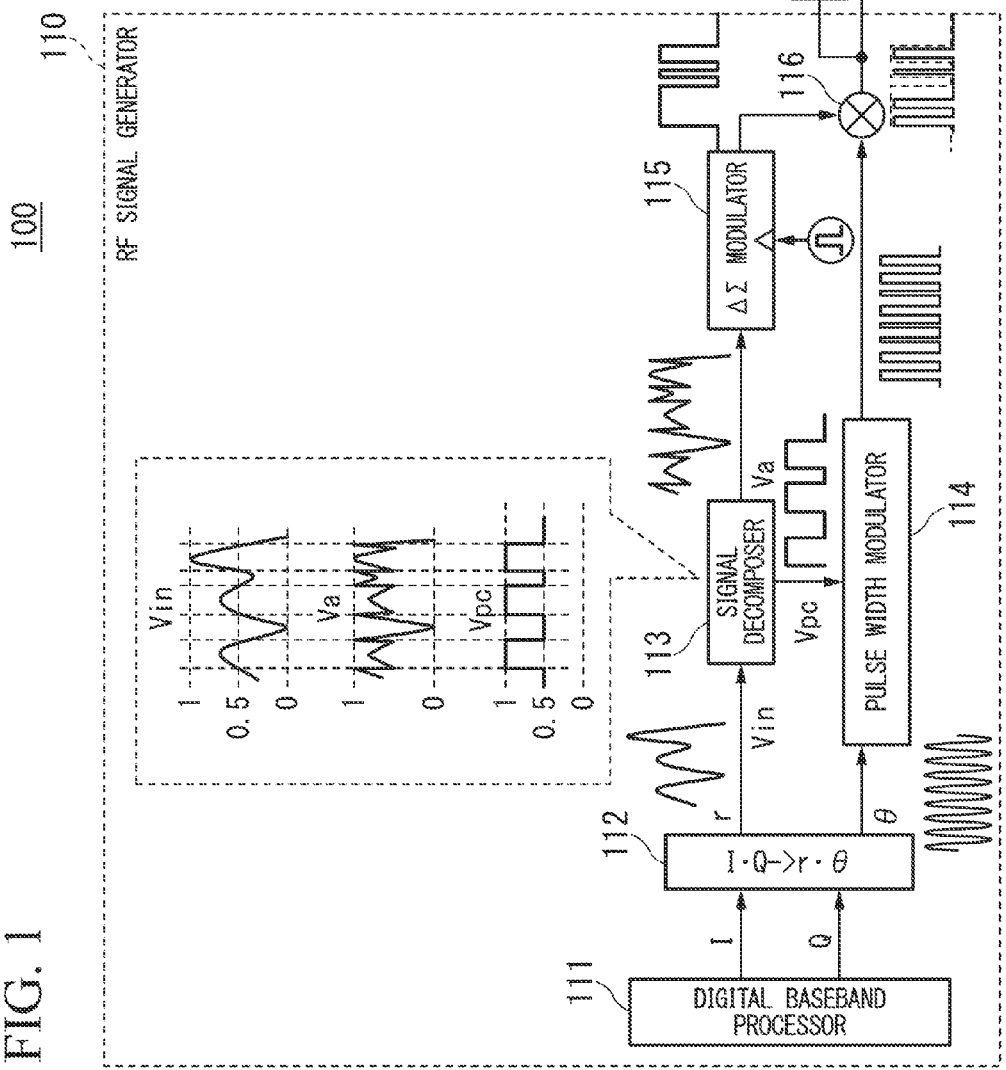
FIG. 1 is a diagram showing an example of a block configuration for a transmitter 100 in accordance with a first embodiment.

FIG. 1 shows an example of a block configuration for a transmitter 100 in accordance with a first embodiment.

The transmitter 100 includes an RF signal generator 110, a driver amplifier 120, and a class-D amplifier circuit 130.

The RF signal generator 110 generates a pulse signal that includes a radio signal. The pulse signal and a complementary signal thereof function as switching (opening and closing) control signals that control (via the driver amplifier 120) the switch elements that form the class-D amplifier circuit 130.

Figure 13:
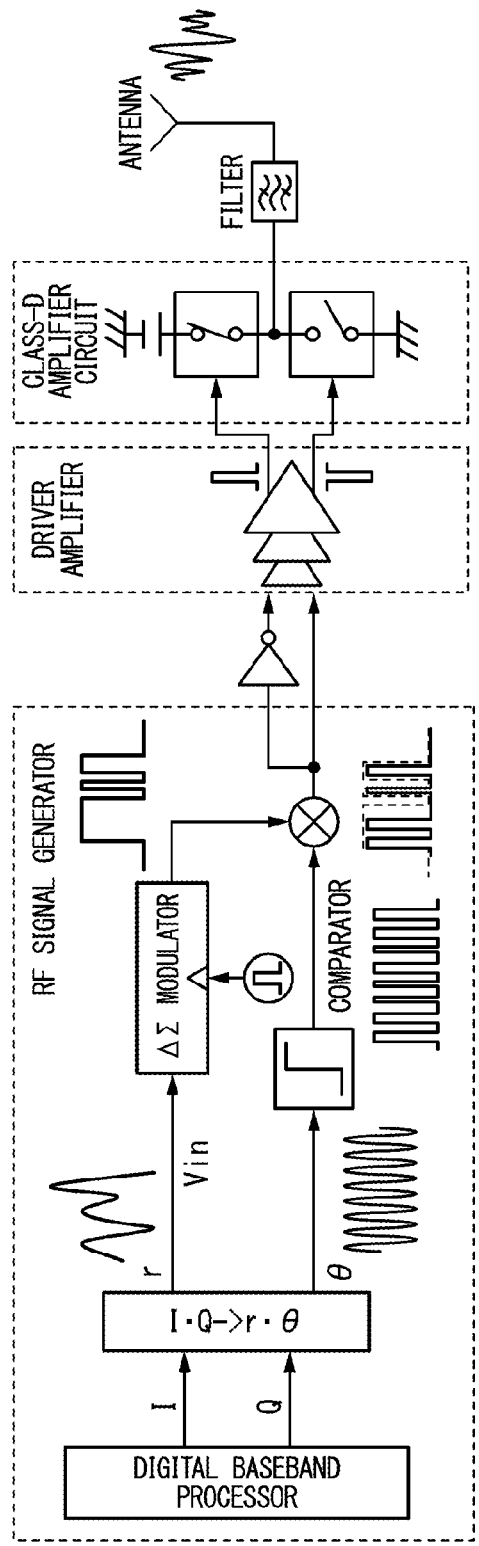
FIG. 13 is a diagram showing an example of a general block configuration for a known transmitter that employs a class-D amplifier circuit.

The pulse signal generated by the RF signal generator 110 can further reduce quantization noise in comparison with the configuration shown in FIG. 13.

The RF signal generator 110 includes a digital baseband processor 111, a polar converter 112, a signal decomposer 113, a pulse width modulator 114, a ΔΣ (delta sigma) modulator 115, and a mixer 116.

The polar converter 112 is a block that converts orthogonal radio signals (I(t), Q(t)) generated by the digital baseband processor 111 into an amplitude signal A(t) and a phase signal P(t). This block is similar to the polar converter in the example of FIG. 13. The amplitude signal A(t) and the phase signal P(t) are represented by the above-described formulas (1) and (2) respectively.

The signal decomposer 113 decomposes the amplitude signal A(t) into a pulse width control signal Vpc and a residual signal Va. In this process, the signal decomposer 113 decomposes the amplitude signal A(t) under a condition that the product of the pulse width (modulation) control signal Vpc and the residual signal Va equals the amplitude signal A(t).

Figure 2:
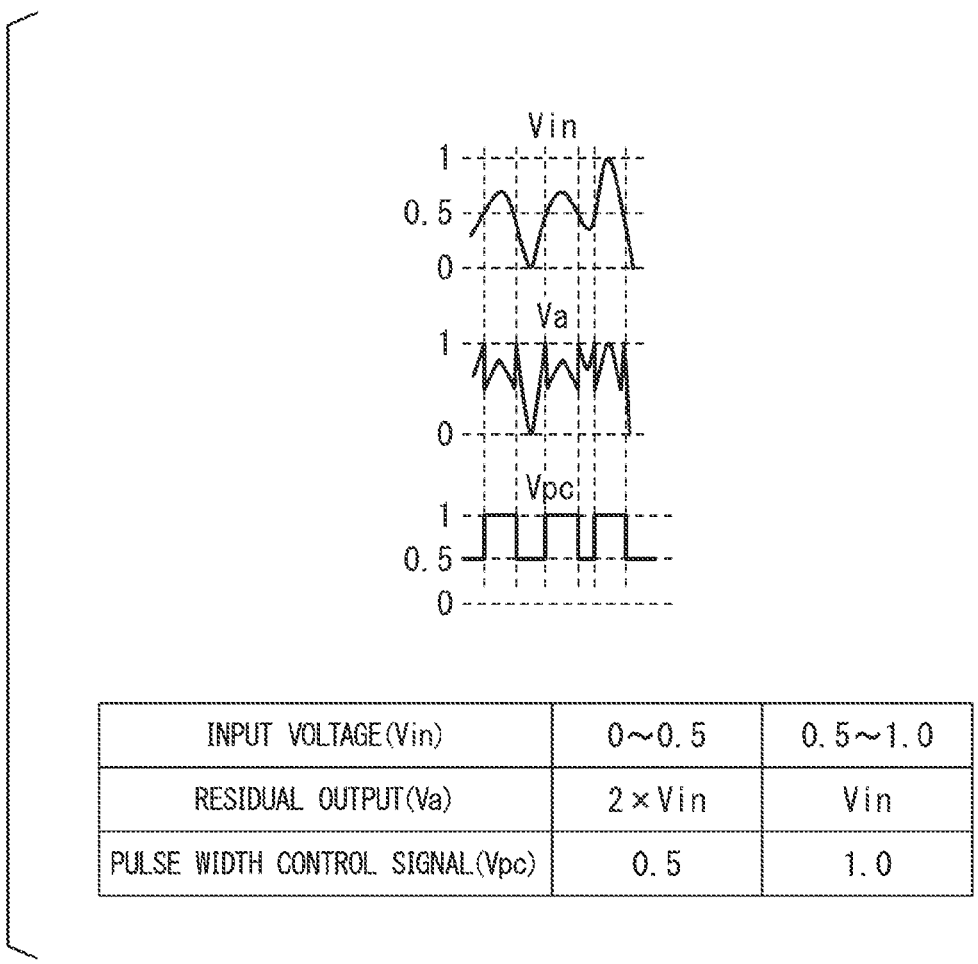
FIG. 2 is a diagram that shows an example of the operation of a signal decomposer 113.

FIG. 2 is a diagram that shows an example of the operation of the signal decomposer 113. Here, it is assumed that an amplitude signal input into the signal decomposer 113 is normalized in a manner such that the maximum value is 1.

When an input signal Vin is within 0 to 0.5, the signal decomposer 113 outputs 0.5 as the pulse width control signal, and outputs twice the input signal, as the residual signal. When the input signal Vin is within 0.5 to 1.0, the signal decomposer 113 outputs 1.0 as the pulse width control signal, and directly outputs the input signal as the residual signal.

For any value of the input signal Vin, the product of the pulse width control signal and the residual signal always equals the input signal.

Figures 8, 9:
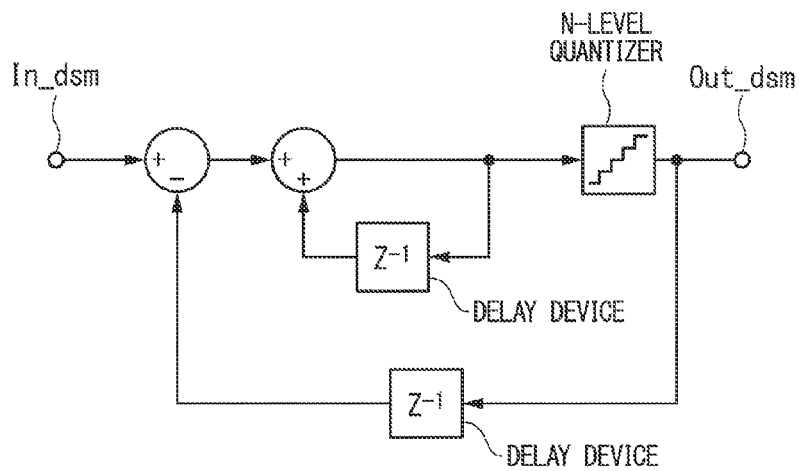
FIG. 8 is a circuit block diagram that shows a specific example of a multilevel ΔΣ modulator.
FIG. 9 is a diagram that shows another example of the operation of the signal decomposer.
Figure 10:
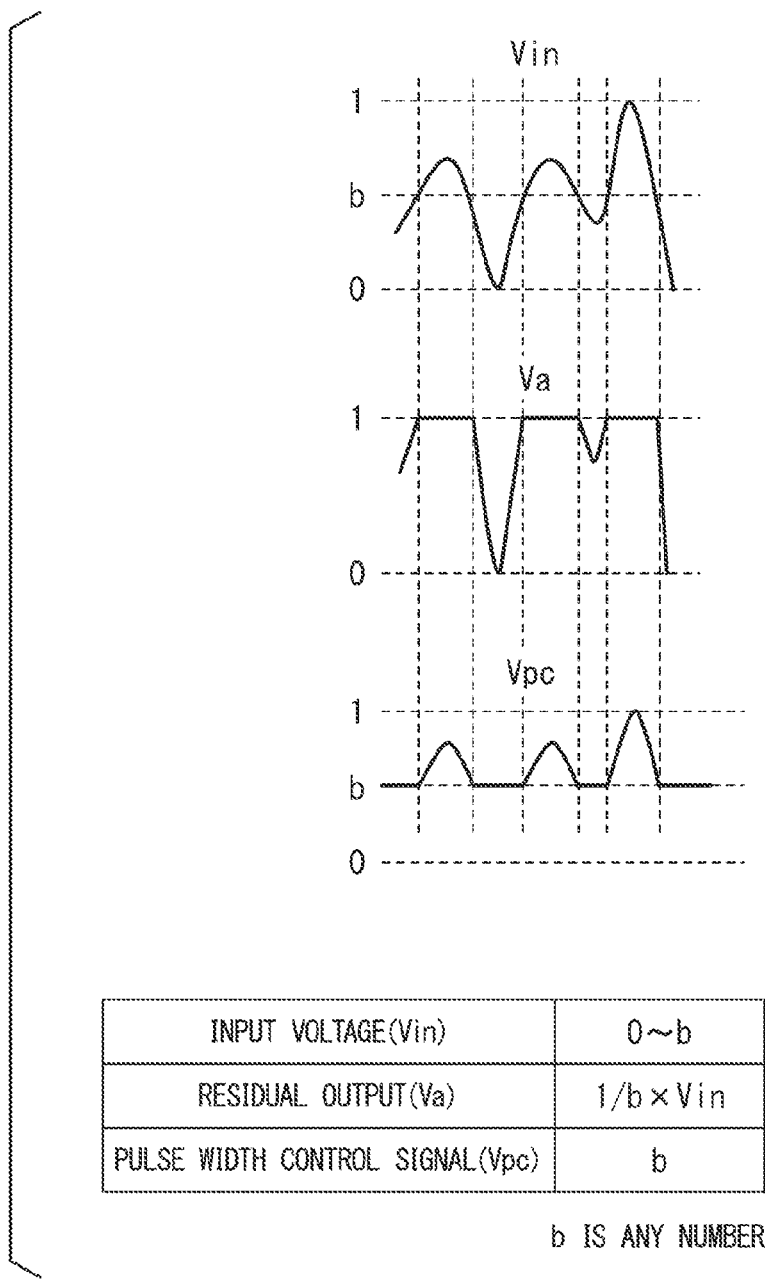
FIG. 10 is a diagram that shows another example of the operation of the signal decomposer.
Figure 11:
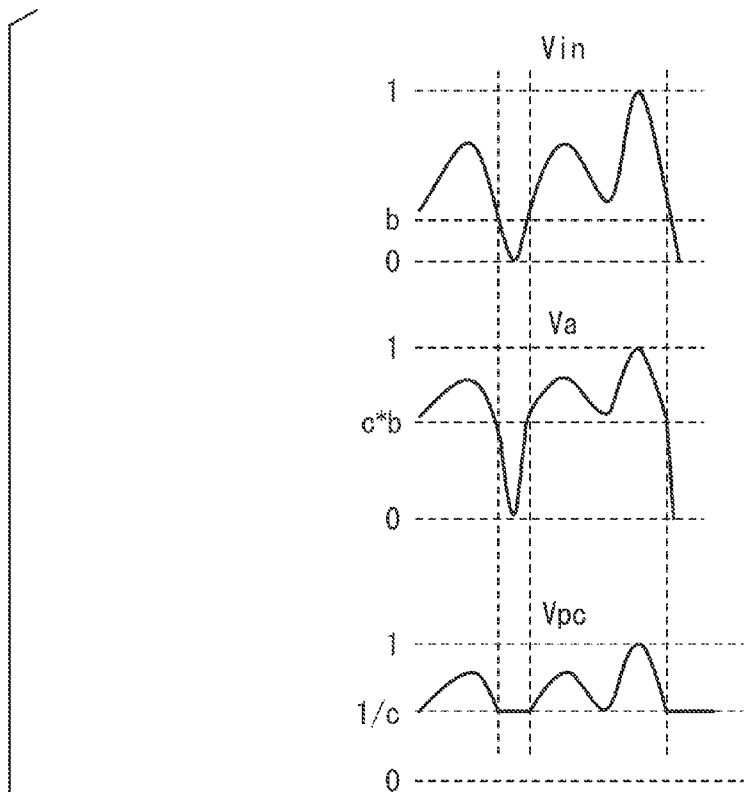
FIG. 11 is a diagram that shows another example of the operation of the signal decomposer.
Figure 12:
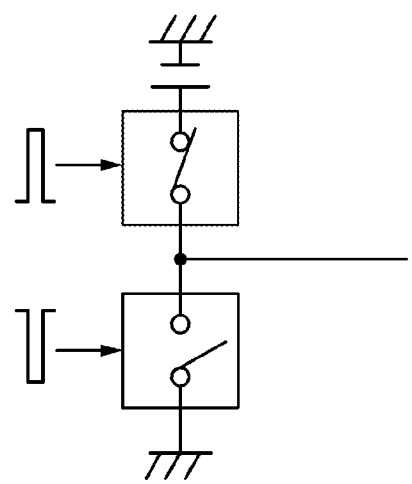
FIG. 12 is a diagram showing an example of a circuit configuration for a class-D amplifier circuit as a representative of known switching amplification circuits.

Other examples of the operation of the signal decomposer 113 are shown in FIGS. 9 to 11.

In the operation example shown in FIG. 2, the algorithm for outputting Va and Vpc varies in two stages according to the value comparison between the input signal and 0.5. By contrast, in the operation example shown in FIG. 9, the relevant algorithm varies in N stages according to the value comparison between the input signal and N−1 thresholds ($b_1$, $b_2$, ..., $b_{N-1}$ in order from the smallest to the largest). Here, $b_1, b_2, ..., b_{N-1}$ are each any number between 0 and 1 and have a relationship of "$b_1 < b_2 < ... < b_{N-1}$".

As shown in FIG. 9, when the input signal is within $b_{k-1}$ to $b_k$, Va is $(1/b_k) \cdot Vin$ and Vpc is $b_k$. In addition, the product of Va and Vpc is always Vin.

Next, in the operation example shown in FIG. 10, for a threshold b that is any number between 0 to 1, Va and Vpc as shown in FIG. 10 are output.

That is, when the input signal exceeds the threshold b, a maximum value (here, 1) that the signal decomposer 113 can handle is constantly output as the residual signal. When the input signal does not exceed b, the input signal is multiplied by any value (here, b/1 that is the reciprocal of the threshold b) and output.

In comparison with the example of FIG. 2, the present operation example produces a smooth waveform for Va can have a small frequency component.

Next, the operation example shown in FIG. 11 can be obtained by further generalizing the operation example of FIG. 10. That is, when the input signal does not exceed any threshold b, the input signal is multiplied by any value that is between 1 to 1/b and the obtained value is output. When the input signal exceeds the threshold b, the input signal is converted into a residual signal and output in a manner such that in the vicinity of the threshold, this residual signal is continuously combined with the residual signal obtained when the input signal does not exceed b, and that the maximum value in the input range of the signal decomposer 113 equals the maximum value in the residual signal output range of the signal decomposer 113. Specific formulas are shown in a table of FIG. 11.

In either case, the product of Va and Vpc is always Vin.

Below, it is assumed that the signal decomposer 113 operates in a manner as shown in FIG. 2.

The phase signal P(t) output from the polar converter 112 is input into the pulse width modulator 114, which transforms this phase signal into a rectangular pulse signal. In this transformation into the pulse signal, the duty ratio of the pulse signal is controlled in accordance with the pulse width control signal output from the signal decomposer 113. In this pulse signal, a sine wave component having a frequency that equals the pulse rate (in other words, a Fourier component equals the pulse rate, the component being called a "fundamental wave component" denoted as "fbase" below) is represented by the following formula (10).

[Formula 10]

$$f\text{base} = \sin(\pi \times DCR/100) \tag{10}$$

In the above formula, DCR denotes the duty ration by %. Additionally, in the above formula (10), the maximum value of fbase is normalized to be 1. The duty ratio at which the fundamental wave component fbase is greatest is 50%.

According to formula (10), the pulse width modulator 114 controls the duty ratio so that the fundamental wave component fbase equals the pulse width control signal.

Figure 3:
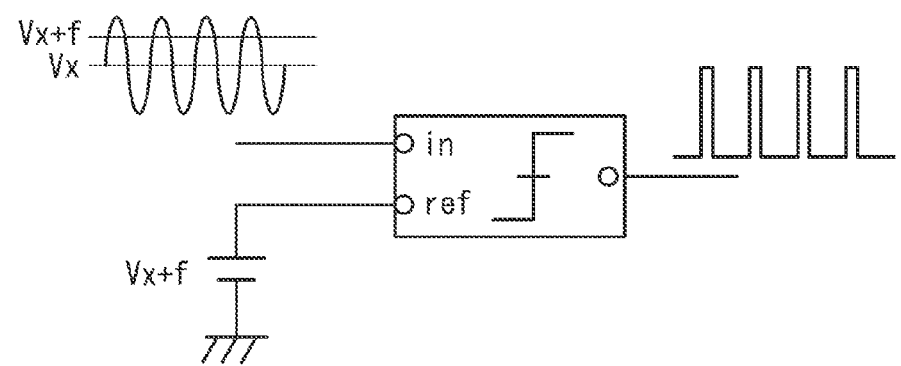
FIG. 3 is a circuit block diagram that shows a specific configuration of a pulse width modulator 114.

FIG. 3 is a circuit block diagram that shows a specific configuration of the pulse width modulator 114.

The pulse width modulator 114 is implemented utilizing a comparator that has an input terminal, a reference terminal, and an output terminal. If a signal input into the input terminal is greater than a reference value Vref, the comparator outputs a high signal. If the input signal is less than Vref, the comparator outputs a low signal.

Here, the input signal (Vcomp_in) is represented by the following formula (11). As shown by this formula, if a sine wave signal is superimposed on a DC (direct current) signal Vx, then when applying Vx+f as the reference value Vref, the duty ratio (DCR) of the pulse signal output from the relevant comparator represented by the following formula (12).

[Formula 11]

$$V\text{comp\_in} = \sin(\omega ct) + Vx \tag{11}$$

[Formula 12]

$$DCR = (100/\pi) \cdot \cos^{-1}(f) \tag{12}$$

The above formula indicates that when f is set to zero, the duty ratio becomes 50%, and that the greater the value of f, the less the duty ratio becomes.

The following formula (13) is obtained based on the above formulas (10) and (12).

[Formula 13]

$$f\text{base} = \sin(\cos^{-1}(f)) \tag{13}$$

The above formula (13) means that the fundamental wave component fbase included in the pulse signal can be controlled utilizing the reference value Vref.

In addition, the following formula (14) is obtained according to formula (13).

[Formula 14]

$$f = \cos(\sin^{-1}(f\text{base})) \tag{14}$$

In accordance with the above formula (14), the fundamental wave component included in the pulse signal output from the pulse width modulator 114 can equal to Vpc by employing a value computed by the following formula (15) to be f.

[Formula 15]

$$f = \cos(\sin^{-1}(Vpc)) \tag{15}$$

Figure 14:
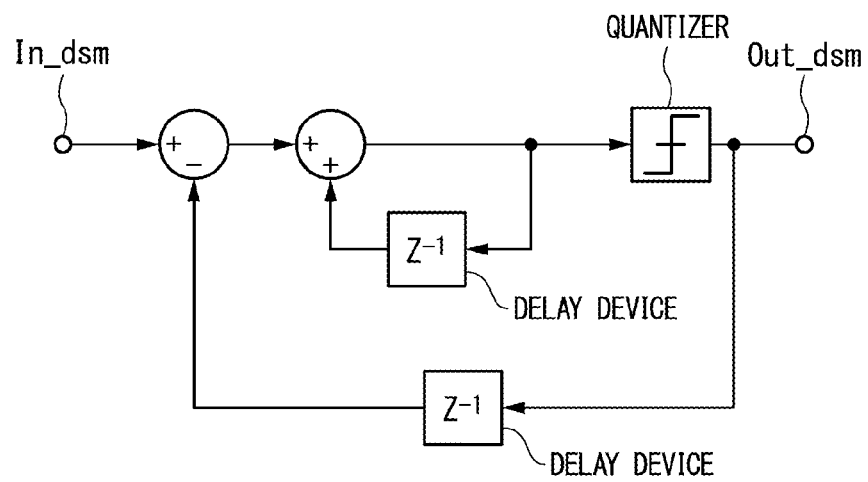
FIG. 14 is a diagram showing a configuration of a known primary ΔΣ modulator.

The ΔΣ modulator 115 has a function of subjecting the input signal to ΔΣ (delta sigma) modulation, and equals that shown in the example of FIG. 14. When respectively representing an input signal and an output signal of the ΔΣ modulator 115 by Y(z) and W(z) and representing quantization noise generated in a relevant quantizer by N(z), a relationship shown by the above formula (6) is obtained between the three items.

The mixer 116 outputs a product of two input signals. A signal output from the ΔΣ modulator 115 and a signal output from the pulse width modulator 114 are input into the mixer 116.

Figure 4:
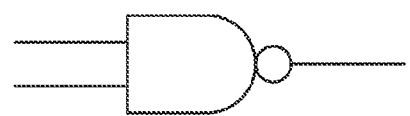
FIG. 4 is a diagram that shows an example of the operation of a mixer 116.

The signal output from the above-described ΔΣ modulator 115 is a signal output from a comparator included therein, and has a value of 1 or −1. When regarding this signal as a high or low signal (since the signal output from the pulse width modulator 114 can be regarded as a high or low signal), the mixer 116 can consist of one NAND operator as shown in FIG. 4. A pulse signal output from this NAND operator is transmitted, as a signal output from the RF signal generator 110, to the driver amplifier 120 at the next stage.

Below, the entire operation of the RF signal generator 110 will be explained.

The orthogonal radio signals generated by the digital baseband processor 111 are decomposed into the amplitude signal A(t) and the phase signal P(t) by the polar converter 112.

The amplitude signal A(t) is input into the signal decomposer 113. In accordance with the value of the input signal, the signal decomposer 113 switches each of the values of the residual signal and the pulse width control signal as the output signals. Below, a case in which the amplitude signal is between 0 to 0.5 will be explained.

The residual signal $V_{a<0.5}$ and the pulse width control signal $V_{pc<0.5}$ are respectively represented by the following formulas (16) and (17).

[Formula 16]

$$V_{a<0.5} = 2 \times A(t) \tag{16}$$

[Formula 17]

$$V_{pc<0.5} = 0.5 \tag{17}$$

The residual signal $V_{a<0.5}$ output from the signal decomposer 113 is input (as the input signal) into the ΔΣ modulator 115. A clock signal input into the ΔΣ modulator 115 is supplied by an external fixed clock source.

The signal $W_{<05}(z)$ output from the ΔΣ modulator 115 is computed by the following formula (18) that is obtained by subjecting $V_{a<05}$ to z-transformation and substituting the transformed value for Y(z) in the above formula (6).

[Formula 18]

$$W_{<05}(z)=2\times A(z)+(1-z^{-1})\cdot N(z) \quad (18)$$

When representing this formula in a time domain, the following formula (19) is obtained.

[Formula 19]

$$W_{<05}(t)=2\times A(t)+NH_{<05}(t) \quad (19)$$

Here, $NH_{<05}(t)$ is the sum of a component obtained by representing the quantization noise $(1-z^{-1})\cdot N(z)$ (see above formula (18)) in a time region and an image component of $2\times A(t)$ that appears when representing $2\times A(z)$ in a time region, where the image component appears within a range greater than or equal to the Nyquist frequency.

When comparing a signal output from the ΔΣ modulator 115 in the example shown by the above formula (8) with the signal output from the ΔΣ modulator 115 in the present embodiment shown by the above formula (8), it is evident that he signal output from the ΔΣ modulator 115 in the present embodiment includes twice the amplitude signal A(t) in the example of formula (8).

The energy of the pulses output from the ΔΣ modulator 115 is constant (since the signal output from the ΔΣ modulator 115 has a pulse waveform having a value of 1 or −1, the energy defined as the square of the signal is always 1). In consideration of the above, the quantization noise $NH_{<05}(t)$ produced in the present embodiment is less than the known quantization noise NH(t) by a value corresponding to an increase in the amplitude component.

The phase signal output from the polar converter 112 is P(t) represented by the above formula (2).

If the pulse width control signal, that is generated when receiving this phase signal as the input signal, is utilized to generate the pulse (phase) signal PR(t) with a duty ratio of 50%, this pulse signal is represented by the above formula (5).

When the amplitude signal input into the signal decomposer 113 has a value between 0 and 0.5, the pulse width control signal Vpc output from the signal decomposer 113 has a value of 0.5. The pulse width modulator 114 that has received this pulse width control signal controls a pulse signal Vpout (t), that is output from the pulse width modulator 114, in a manner such that the fundamental wave component fbase has a value of 0.5. That is, the pulse signal Vpout (t) is represented by the following formula (20).

[Formula 20]

$$V\text{pout}(t)=0.5\times P(t)+g_{<05}(H(t)) \quad (20)$$

In the above formula (20), $g_{<05}(H(t))$ is a component that is included in Vpout(t) and other than $0.5\times P(t)$. Here, $g_{<05}(H(t))$ is a harmonic component of P(t).

The mixer 116 outputs a product of the pulse signal Vpout (t) represented by the above formula (20) and the signal $W_{<05}(t)$ (output from the ΔΣ modulator 115) represented by the above formula (19). Therefore, an output signal MIX(t) output from the mixer 116 is represented by the following formula (21).

[Formula 21]

$$\text{MIX}(t)=A(t)\cdot P(t)+2\times A(t)\cdot g_{<05}(H(t))+0.5\times P(t)\cdot NH_{<05}(t)+NH_{<05}(t)\cdot g_{<05}(H(t)) \quad (21)$$

As shown by the first term on the right side of formula (21), the pulse signal output from the mixer 116 includes a radio signal component. In addition, the terms other than the first term are unnecessary components.

The signal output from the mixer 116 is transmitted as an RF pulse signal of the RF signal generator 110 to the next stage (i.e., the driver amplifier 120 and the class-D amplifier circuit 130).

As described above, the quantization noise $NH_{<05}(t)$ generated by the ΔΣ modulator 115 is less than conventional quantization noise NH(t). When comparing the third term on the right side of formula (9) (that indicates the RF pulse signal in the above-described example) with the third term on the right side of formula (21), it is evident that the RF pulse signal generated in the present embodiment has a quantization noise less than that of an RF pulse signal in the known example.

Additionally, since the second and fourth terms of formula (21) each include $g_{<05}(H(t))$, the frequency component of the quantization noise is twice or more higher than a frequency band occupied by a desired signal component. Therefore, the relevant quantization noise can be removed by the filter 40 next to the class-D amplifier circuit 130.

Next, a case in which the amplitude signal A(t) input into the signal decomposer 113 has a value between 0.5 and 1 will be explained. In this case, a residual signal $V_{a>05}$ and a pulse width control signal $V_{pc>05}$ are represented by the following formulas (22) and (23).

[Formula 22]

$$V_{a>05}=A(t) \quad (22)$$

[Formula 23]

$$V_{pc>05}=1 \quad (23)$$

In the present case, the amplitude signal A(t) is input into the ΔΣ modulator 115 and the phase signal P(t) is input into the pulse width modulator 114, so that a rectangular signal having a duty ratio of 50% is output.

This case of the present embodiment performs an operation similar to that of the example shown in FIG. 13. That is, the RF pulse signal output from the RF signal generator 110 is represented by the above-described formula (9).

Accordingly, in the present embodiment, the quantization noise is reduced when the amplitude signal A(t) is between 0 and 0.5, and an operation equal to a known example is performed when A(t) is between 0.5 and 1. Generally, radio signals on W-CDMA and the like have an average amplitude signal of 0.5 or smaller (normalized value). In consideration of this, the present embodiment considerably contributes to the reduction in the quantization noise.

Figure 5:
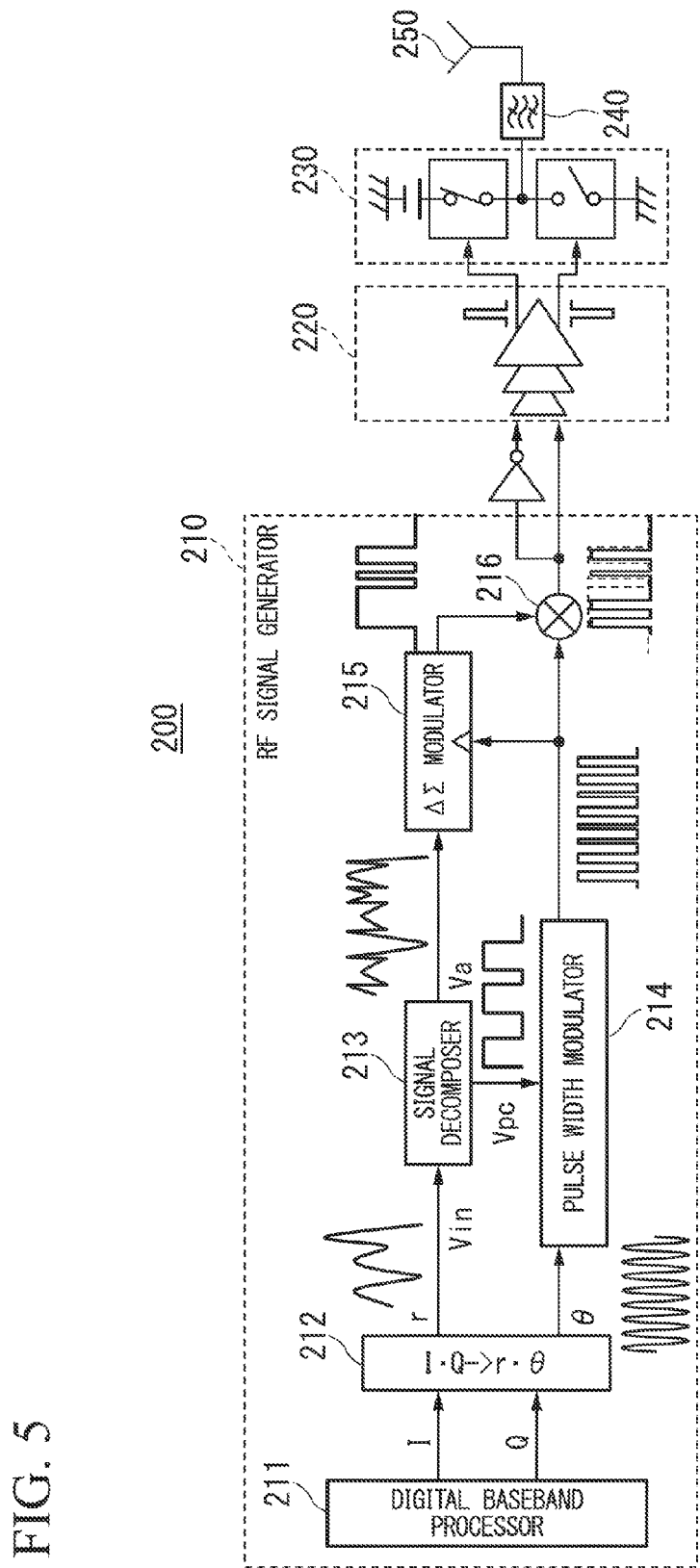
FIG. 5 is a diagram showing an example of a block configuration for a transmitter 200 in accordance with a second embodiment.

FIG. 5 shows an example of a block configuration for a transmitter 200 in accordance with a second embodiment.

The transmitter 200 includes an RF signal generator 210, a driver amplifier 220, and a class-D amplifier circuit 230.

The RF signal generator 210 generates a pulse signal that includes a radio signal. The pulse signal and a complementary signal thereof function as switching (opening and closing) control signals that control (via the driver amplifier 220) the switch elements that faun the class-D amplifier circuit 230.

The driver amplifier 220 and the class-D amplifier circuit 230 equal to those having identical names in the first embodiment.

The RF signal generator 210 includes a digital baseband processor 211, a polar converter 212, a signal decomposer 213, a pulse width modulator 214, a ΔΣ modulator 215, and a mixer 216. The structures thereof each equal to those which have identical names and form the RF signal generator 110 in the first embodiment.

In the RF signal generator 110, the clock signal of the ΔΣ modulator is supplied from an external fixed clock source. In comparison therewith, in the RF signal generator 210, the signal output from the pulse width modulator 214 is utilized as the clock signal of the ΔΣ modulator 215. According to this configuration, two pulse signals (output from the ΔΣ modulator 215 and the pulse width modulator 214) input into the mixer 216 are in synchronism with each other.

If they are not in synchronism with each other, the two pulse signals differ from each other in signal transit timing so that the pulse signal output from the mixer 216 has a pulse width that is considerably narrower than that of the input pulse signal. Here, the narrower the pulse width of a signal, the higher the frequency of the signal becomes. Therefore, in actual devices, such a narrower pulse width causes a problem such that signal waveforms tend to be deformed due to parasitic elements. The present embodiment can solve such a problem.

Figure 6:
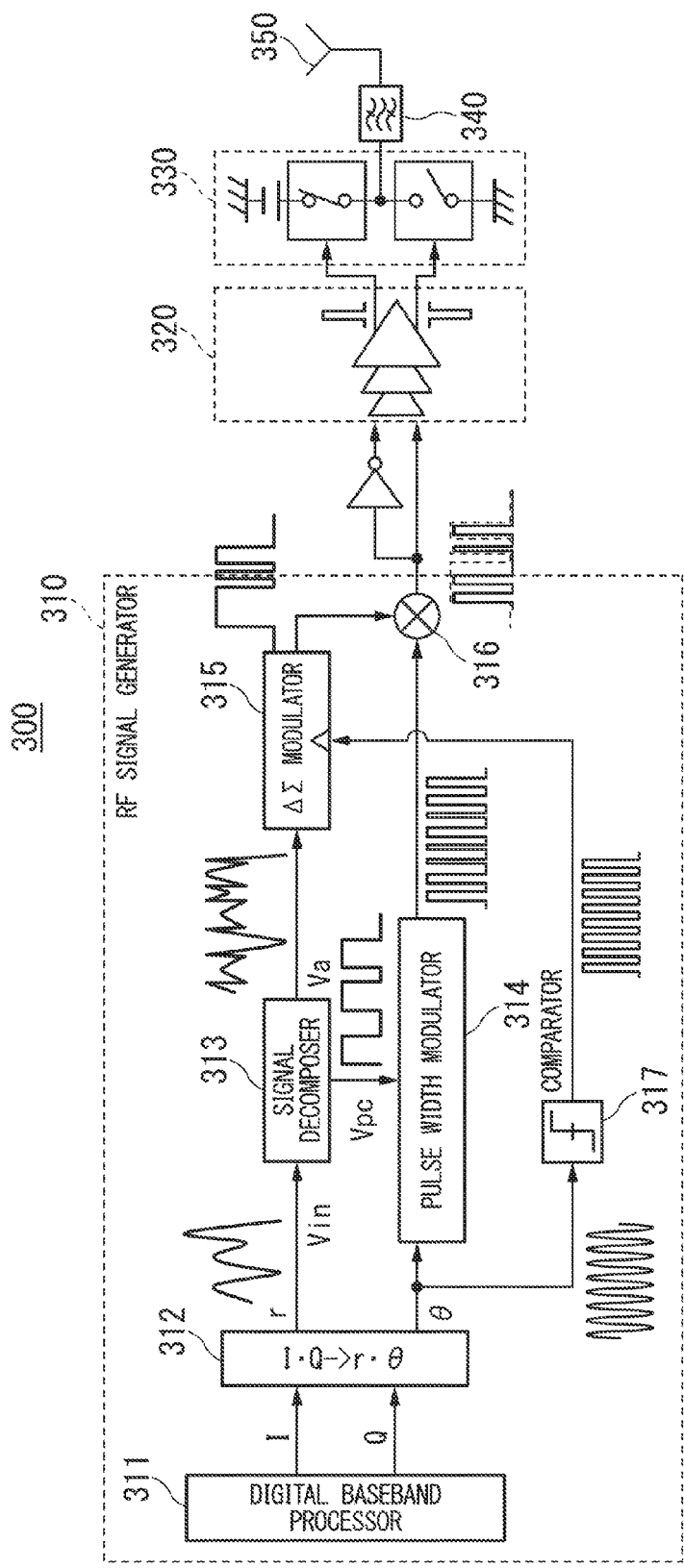
FIG. 6 is a diagram showing an example of a block configuration for a transmitter 300 in accordance with a third embodiment.

FIG. 6 shows an example of a block configuration for a transmitter 300 in accordance with a third embodiment.

The transmitter 300 includes an RF signal generator 310, a driver amplifier 320, and a class-D amplifier circuit 330.

The RF signal generator 310 generates a pulse signal that includes a radio signal. The pulse signal and a complementary signal thereof function as switching (opening and closing) control signals that control (via the driver amplifier 320) the switch elements that form the class-D amplifier circuit 330.

The driver amplifier 320 and the class-D amplifier circuit 330 equal to those having identical names in the first embodiment.

The RF signal generator 310 includes a digital baseband processor 311, a polar converter 312, a signal decomposer 313, a pulse width modulator 314, a ΔΣ modulator 315, a comparator 317, and a mixer 316. The structures of them each equal to those which have identical names and form the RF signal generator in the example of FIG. 13 and the RF signal generator 110 in the first embodiment.

In the RF signal generator 210, the signal output from the pulse width modulator 214 is utilized as the clock signal of the ΔΣ modulator 215. In comparison therewith, in the RF signal generator 310, a signal obtained by transforming the phase signal P(t) (by the comparator 317) into a pulse signal having a duty ratio of 50% is utilized as the clock signal of the ΔΣ modulator 315.

In the RF signal generator 210, the duty ratio of the clock signal of the ΔΣ modulator may be less than 50%. In comparison therewith, in the RF signal generator 310, the duty ratio is always 50%. When the duty ratio is less than 50%, a higher frequency component (than that generated in other cases) is generated, which causes a problem such that signal waveforms tend to be deformed due to parasitic elements in actual devices. The present embodiment can solve such a problem.

Figure 7:
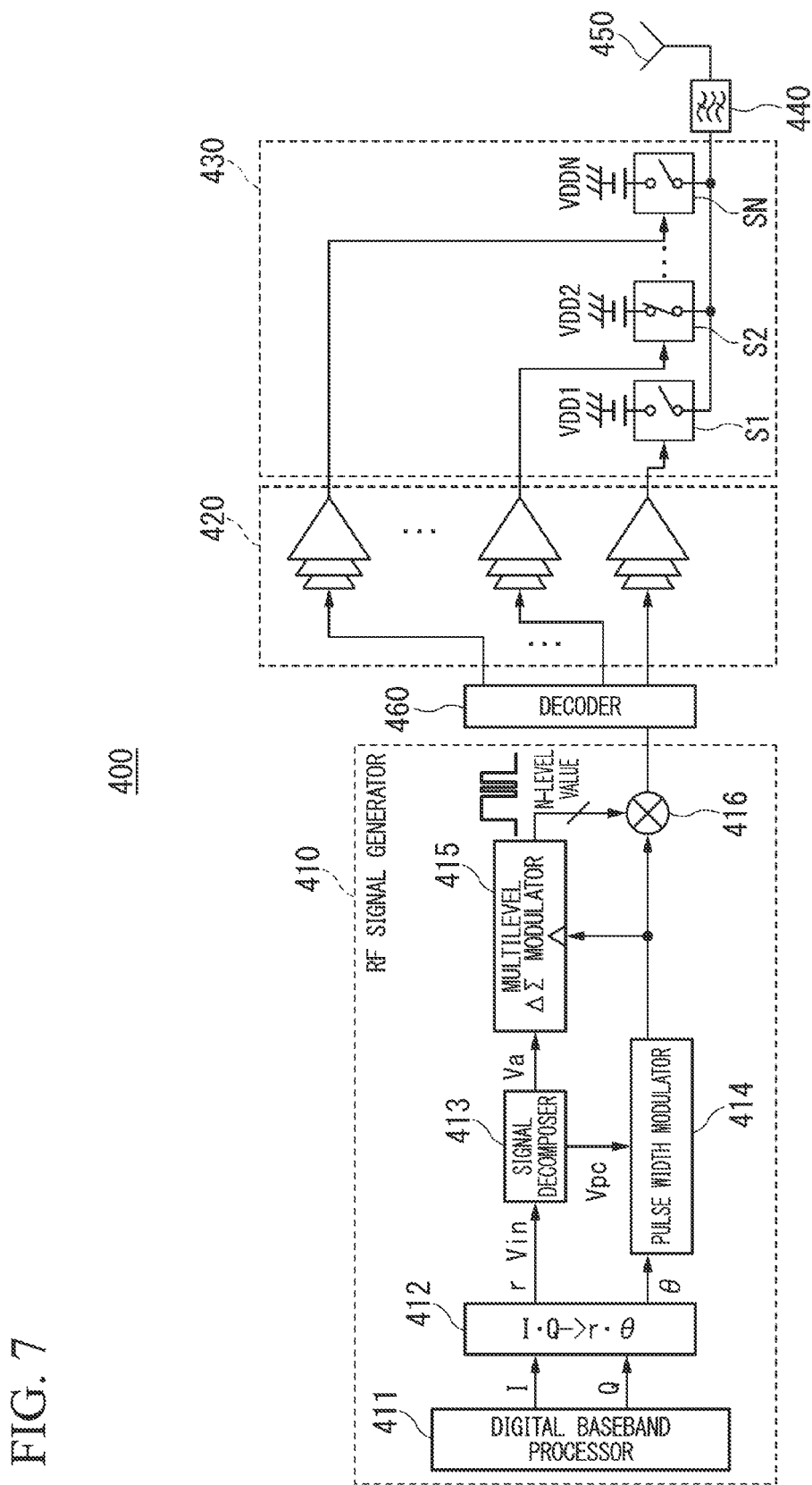
FIG. 7 is a diagram showing an example of a block configuration for a transmitter 400 in accordance with a fourth embodiment.

FIG. 7 shows an example of a block configuration for a transmitter 400 in accordance with a fourth embodiment.

The transmitter 400 includes an RF signal generator 410, a decoder 460, a driver amplifier 420, and a multilevel class-D amplifier circuit 430.

The RF signal generator 410 generates a pulse signal that includes a radio signal. The pulse signal is input via the decoder 460 to the multilevel class-D amplifier circuit 430 at the next stage, so that a multilevel pulse signal is amplified while the waveform thereof is maintained.

The signal output from the multilevel class-D amplifier circuit 430 is emitted through an antenna 450 after unnecessary components thereof are removed by a filter 440 next to the circuit 430.

As an example, it is assumed that a multilevel pulse signal can have a value among N values (N is an integer 2 or greater, and N values are $VP_1, VP_2, \ldots, VP_N$ from the smallest to the largest).

As shown in FIG. 7, the multilevel class-D amplifier circuit 430 consists of N switch elements.

In the N switch elements ($S_1, S_2, \ldots, S_N$), one end of each of them is connected to one another so as to be output (as a signal output from the multilevel class-D amplifier circuit 430) to the filter 440 at the next stage. The other ends of the switch elements are connected to power supplies having different power-supply voltages ($VDD_1, VDD_2, \ldots, VDD_N$ from the lowest to the highest, which are respectively connected to $S_1, S_2, \ldots, S_N$).

When the signal output from the RF signal generator 410 is $VP_k$ (k is an integer between 1 to N), the decoder 460 makes the switch element Sk (that forms the multilevel class-D amplifier circuit 430) on and makes all other switches off. In this state, the multilevel class-D amplifier circuit 430 outputs $VDD_k$.

Additionally, in order for the multilevel class-D amplifier circuit 430 to amplify without distortion, the radio signal included in the multilevel pulse signal generated in the RF signal generator 410, a ratio between the interval between the adjacent signal values in the multilevel pulse signal and the interval between the adjacent voltages is determined and stored to satisfy the following formula (24).

[Formula 24]

$$VP_2-VP_1:VP_a-VP_2:\ldots:VP_{k+1}-VP_k:\ldots:VP_N-VP_{N-1}=VDD_2-VDD_1:VDD_3-VDD_2:\ldots:VDD_{k+1}-VDD_k:\ldots:VDD_N-VDD_{N-1} \quad (24)$$

The RF signal generator 410 that generates a multilevel pulse signal includes a digital baseband processor 411, a polar converter 412, a signal decomposer 413, a pulse width modulator 414, a multilevel ΔΣ modulator 415, and a mixer 416.

The configuration of the RF signal generator 410 is obtained by replacing the ΔΣ modulator 215 in the RF signal generator 210 of the second embodiment whose configuration is shown in FIG. 5, with the multilevel ΔΣ modulator 415.

FIG. 8 is a circuit block diagram that shows a specific example of the multilevel ΔΣ modulator 415.

This circuit consists of delay devices, a multilevel quantizer, an adder, and a subtracter and is obtained by replacing the quantizer (called a "binary quantizer" below) of the ΔΣ modulator shown in FIG. 14 with the multilevel quantizer.

In the present example, it is assumed that the multilevel quantizer has N output values (N is an integer 2 or greater). In the present multilevel quantizer, one of the N values is selected and output in accordance with a value comparison utilizing N−1 thresholds. When the input signal and the output signal of the multilevel ΔΣ modulator 415 are each denoted by Y(z) and W(z) and quantization noise generated in the multilevel quantizer is denoted by Nm(z), the following formula (25) is obtained between them.

[Formula 25]

$$W(z)=Y(z)+(1-z^{-1})\cdot Nm(z) \quad (25)$$

In comparison with the above formula (6), N(z) included in the signal output from the ΔΣ modulator is replaced with Nm(z) to obtain formula (25). Since the number of values that the multilevel quantizer can have is greater than that of the binary quantizer, the generated quantization noise Nm(z) is less than the quantization noise N(z) generated by the binary quantizer.

In the RF signal generator 410, an N-level output signal from the multilevel ΔΣ modulator 415 and a pulse signal output from the pulse width modulator 414 are input into the mixer 416. When the smallest value of the signal output from the multilevel ΔΣ modulator 415 is set to 0 and the value of the pulse signal output from the pulse width modulator 414 is determined to be 1 or 0, the pulse signal output from the mixer 416 can have a value that equals the N values output from the multilevel ΔΣ modulator 415. The signal output from the mixer 416 is transmitted, as the signal output from the RF signal generator 410, to the decoder 460 at the next stage.

In the present embodiment, the quantization noise is less than that generated in the second embodiment as shown in FIG. 5.

While the present invention have been described using embodiments, the technical range of the present invention is not limited thereto. It is obvious for those skilled in the art that various modifications or improvements can be applied to the embodiments in the range of the claims.

INDUSTRIAL APPLICABILITY

In accordance with the present invention, quantization noise generated by a ΔΣ modulator can be reduced, and thereby an RF pulse signal having a preferable signal-to-noise ratio can be generated.

REFERENCE SIGNALS 100 transmitter
111 digital baseband processor
112 polar converter
113 signal decomposer
114 pulse width modulator
115 ΔΣ modulator
116 mixer
120 driver amplifier
130 class-D amplifier circuit

The invention claimed is:

1. An RF signal generating circuit that generates, from a digital signal, an RF pulse signal to be radio-transmitted, the circuit comprising:
    a polar converter that generates an amplitude signal and a phase signal from the digital signal;
    a signal decomposer that receives, as an input signal, the amplitude signal output from the polar converter, and generates two signals which are a pulse width control signal and a residual signal;
    a delta sigma modulator that subjects the residual signal to delta-sigma modulation;
    a pulse width modulator that subjects the phase signal output from the polar converter to pulse modulation in accordance with the pulse width control signal, and outputs a pulse phase signal; and
    a mixer that mixes a signal output from the delta sigma modulator and the pulse phase signal together to output the RF pulse signal,
    wherein the signal decomposer generates the pulse width control signal and the residual signal under a condition that a product of a fundamental wave component of the pulse phase signal and the residual signal equals the amplitude signal.

2. The RF signal generating circuit in accordance with claim 1, wherein:
    if the input signal exceeds any given threshold, the signal decomposer outputs the input signal as the residual signal, and otherwise, the signal decomposer multiplies the input signal by any given value and outputs a product thereof as the residual signal.

3. The RF signal generating circuit in accordance with claim 1, wherein:
    if the input signal exceeds any given threshold, the signal decomposer outputs, as the residual signal, a maximum value among values which the signal decomposer is able to handle, and otherwise, the signal decomposer multiplies the input signal by any given value and outputs a product thereof as the residual signal.

4. The RF signal generating circuit in accordance with claim 1, wherein:
    if the input signal does not exceed any given threshold, the signal decomposer multiplies the input signal by any given value and outputs a product thereof as the residual signal, and otherwise, the signal decomposer converts the input signal into the residual signal and outputs the residual signal in a manner such that in the vicinity of the threshold, this residual signal is continuously combined with the residual signal obtained when the input signal does not exceed the threshold, and that a maximum value in an input range of the signal decomposer equals a maximum value in a residual signal output range of the signal decomposer.

5. The RF signal generating circuit in accordance with claim 1, wherein:
    the pulse width modulator inputs the phase signal that is output from the polar converter into a comparator, where a value of the pulse width control signal functions as a reference value of the comparator.

6. The RF signal generating circuit in accordance with claim 1, wherein:
    the delta sigma modulator operates in synchronism with the pulse phase signal output from the pulse width modulator.

7. The RF signal generating circuit in accordance with claim 1, wherein:
    the delta sigma modulator operates in synchronism with the phase signal output from the polar converter.

8. The RF signal generating circuit in accordance with claim 1, wherein:
    the delta sigma modulator includes a comparator that outputs an N-level value, and the signal output from the delta sigma modulator has a value selected from N values, where N is an integer of 2 or greater.

9. A transmitter that generates, from a digital signal, an RF pulse signal to be radio-transmitted, the transmitter comprising:
    a polar converter that generates an amplitude signal and a phase signal from the digital signal;
    a signal decomposer that receives, as an input signal, the amplitude signal output from the polar converter, and generates two signals which are a pulse width control signal and a residual signal;
    a N-level delta sigma modulator that subjects the residual signal to delta-sigma modulation to output a N-level signal having a step-by-step value, where N is an integer of 2 or greater;
    a pulse width modulator that subjects the phase signal output from the polar converter to pulse modulation in accordance with the pulse width control signal, and outputs a pulse phase signal;

a mixer that mixes a signal output from the N-level delta sigma modulator and the pulse phase signal together to output the RF pulse signal; and a class-D amplifier circuit that has two or more switch elements connected respectively to power supplies which have different power-supply voltages, wherein the signal decomposer generates the pulse width control signal and the residual signal under a condition that a product of a fundamental wave component of the pulse phase signal and the residual signal equals the amplitude signal, and in accordance with the value of the signal output from the N-level delta sigma modulator, the class-D amplifier circuit makes only one of the switch elements on and makes all other switch elements off to output the RF pulse signal to be radio-transmitted.

\* \* \* \* \*